(12) United States Patent
Hull et al.

(10) Patent No.: US 6,407,581 B1
(45) Date of Patent: Jun. 18, 2002

(54) HIGH VOLTAGE MULTIPURPOSE INPUT/OUTPUT CIRCUIT

(75) Inventors: Richard Hull, Puyallup, WA (US); Eric Schroeder, Tempe, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/817,215

(22) Filed: Mar. 27, 2001

(51) Int. Cl.$^7$ .......................................... H03K 19/0175
(52) U.S. Cl. ............................................ 326/83; 326/80
(58) Field of Search ............................. 326/83, 80–82, 326/86–87, 90–91

(56) References Cited

U.S. PATENT DOCUMENTS

| 5,635,860 A | * | 6/1997 | Westerwick | ............... | 326/81 |
| 5,646,550 A | * | 7/1997 | Campbell, Jr. et al. | ....... | 326/81 |
| 5,825,206 A | * | 10/1998 | Kirshnamurthy et al. | ..... | 326/81 |

FOREIGN PATENT DOCUMENTS

| JP | 403175727 A | * | 7/1991 | ................. | 326/30 |

* cited by examiner

*Primary Examiner*—Michael Tokar
*Assistant Examiner*—James H Cho
(74) *Attorney, Agent, or Firm*—Swidler Berlin Shereff Friedman, LLP

(57) ABSTRACT

A multipurpose input/output circuit providing full input output current drive capability and special mode selection on a single device pin. The circuit includes first and second high voltage detectors coupled to the pin, at least one pin bias circuit, and a mode selector. The mode selector determines whether the pin operates as either an input or output. One of the high voltage detectors detects a high voltage on the pin and causes the bias circuit to disconnect the pin from the supply voltage. The other high voltage detector operates to detect a special mode voltage on the pin and set the device into a special mode.

10 Claims, 3 Drawing Sheets

_US 6,407,581 B1_

HIGH VOLTAGE MULTIPURPOSE INPUT/OUTPUT CIRCUIT

BACKGROUND OF THE INVENTION

The present invention relates to input/output circuits, and more particularly to an input/output circuit that can handle both a high voltage supply voltage and low signal voltages. Generally, in semiconductor devices it is desirable to have as few device pins as possible. This criterion reduces, for example, the area that a device occupies on a printed circuit board, and tends to lower the device cost.

Many devices have some form of special operation, such as a test mode. Commonly, placing a device into its special mode, such as a test mode, requires applying a signal to the device indicating that the device should operate in its special mode. Frequently this signal is a voltage higher than the supply voltage for the device, such as higher than $V_{DD}$. To reduce the number of pins for a device, one or more of the device pins needs to be a multi-purpose pin. In other words, such a pin would be used to place the device into its special mode, as well as for one of the ordinary functions of the device. However, a device is commonly placed in its special mode by applying a high voltage to the device. Accordingly, there is a need to have a circuit that can accommodate the high voltage input as well as the normal signal voltages for the device.

SUMMARY OF THE INVENTION

It is an object of the present invention to provide a multipurpose input/output circuit that can accommodate a high voltage special mode input signal as well as normal signal voltages for the associated circuitry.

It is another object of the present invention to provide a multipurpose input/output circuit that can accommodate a high voltage special mode input signal and provide full input/output current drive capability.

It is a further object of the present invention to provide a reduced pin device including a multipurpose input/output pin having full input/output drive capability and capable of accommodating a high voltage special mode signal.

To achieve the above and other objects, the present invention provides a multipurpose input/output circuit operatively connected to a contact and operatively connectable to receive first and second supply voltages, comprising; a first voltage detector operatively connected to detect a first voltage; a second voltage detector operatively connected to detect a second voltage; a high voltage switch connected to provide a supply voltage or a contact voltage in accordance with the first voltage; a selector operatively connected to provide a plurality of selection signals; a pull up circuit operatively connected to the high voltage switch and between the contact and at least one of the supply voltages and operatively connected to disconnect the contact from at least one of the supply voltages in response to at least one of a selection signal and detection of the first voltage.

To achieve the above and other objects, the present invention also provides a method of operating a multipurpose input/output circuit operatively connected to a contact and operatively connectable to receive first and second supply voltages, comprising: detecting a first voltage on the contact; detecting a second voltage on the contact representative of a purpose of the multipurpose input/output circuit; providing one of $V_{DD}$ and the contact voltage responsive to detecting of the first voltage; providing a plurality of selection signals; and selectively disconnecting the contact from one of the supply voltages responsive to at least one of a selection signal and the operation of providing one of a second high voltage and the first voltage.

DETAILED DESCRIPTION OF THE PREFERRED EMBODIMENTS

The present invention provides an improved input/output circuit that can function with full input/output drive capability and handle a high voltage special mode input signal. Many semiconductor devices have special modes of operation, such as a test mode. One example of such a device is Microchip part number PIC16C508. This typical device includes a combination pin for placing the device in a special test mode and that can drive normal output voltage, but only at a low current. This pin, however, does not have full input/output drive capability. The low voltage current drive capability is limited to, for example, 0.1 mA. This compares to other input/output pins on the device, which have a typical drive capability of, for example, 20 mA. Prior to the present invention, applying a high voltage to a high current I/O pin of Microchip part number PIC16C508 would cause MOS transistors on this pad to conduct through their parasitic bipolar connections and limit the pin voltage near $V_{DD}$ such as $V_{DD}$+approximately 0.6 v. Even the special mode pin of the PIC16C508 does not have full input/output capability. As seen from the following, the present invention allows a high voltage to be applied to an input/output pin without causing the input to be limited near $V_{DD}$, and allows the pin to provide full input/output drive capability in low voltage (normal user) mode.

Figure 1:
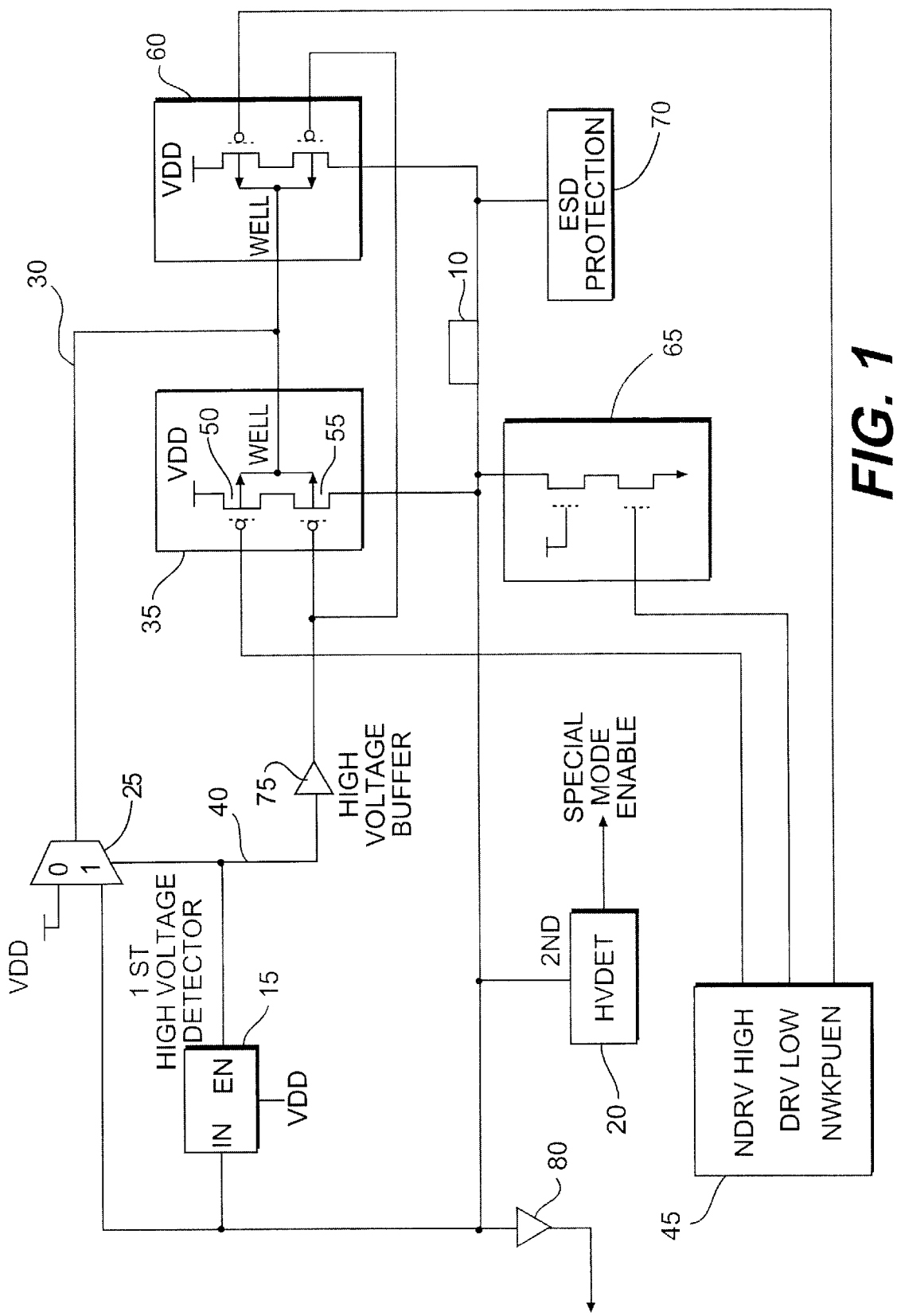
FIG. 1 is a block diagram of an embodiment of the present invention.

14. FIG. 1 is a block diagram of an embodiment of the present invention. In FIG. 1, contact 10 can be connected to, for example, an external pin of a device. In the FIG. 1 embodiment, a first high voltage detector 15 and a second high voltage detector 20 are also connected to the contact. This connection need not be direct and can be via, for example, a buffer or other circuitry that provides the voltage at the contact 10 to the other circuitry. The first high voltage detector 15 detects a first voltage on the contact 10 that is above, for example, $V_{DD}$. In a preferred embodiment, the first voltage is approximately $V_{DD}$+0.7 v. This voltage obviously can be changed depending upon the particular application. Some example selection criteria include the voltages that the associated input circuitry can withstand and the overall reaction time that is desired for the multipurpose input/output circuit.

The second high voltage detector 20 detects a second voltage on the contact 10. In the preferred embodiment, the second voltage is higher than the first voltage, and is selected to denote a special mode. The degree to which the second voltage is higher than the first voltage depends upon the particular application. An example of the selection criteria includes the voltage swing allowed due to noise on the contact 10 before a special mode is recognized. As seen in FIG. 1, the second voltage detector 20 provides a special mode enable signal upon detection of the second voltage on the contact 10. The special mode enable signal can be used by circuitry associated with the multipurpose input/output circuit to enable a special mode of operation for that associated circuitry.

In the embodiment shown in FIG. 1, a high voltage switch 25 switches its output 30 between two voltages, such as $V_{DD}$ and a voltage corresponding to that on the contact 10. This switching is responsive to the output of the first high voltage detector 15. In a preferred embodiment, when the first high voltage detector 15 detects the first voltage, the output 30 goes to a high voltage, such as a voltage higher than $V_{DD}$ and almost equal to the voltage on contact 10. Otherwise, the output 30 remains at $V_{DD}$.

The output 30 of the high voltage switch 25 is used in the control of a bias circuit 35 shown in FIG. 1. As shown in the exemplary embodiment of FIG. 1, the bias circuit is a pull up circuit. Depending upon the application, the bias circuit 35 may provide other biasing. For convenience of discussion, the following refers to bias circuit 35 as a pull up circuit.

In the preferred embodiment, the output 30 controls the well voltage of the transistors included in pull up circuit 35. Typically, if the voltage on the contact 10 is less than the first voltage that is detected by the first high voltage detector 15, the output 40 of the first high voltage detector 15 will be 0 v and thus 30 will be equal to $V_{DD}$. In this circumstance, the pull up circuit functions in accordance with an output of a selector 45. If the NDRVHIGH output is a low voltage, then a first one of the transistors 50 in pull up circuit 35 is on. As a result, in the above circumstance, the contact 10 is pulled toward $V_{DD}$. This is because a second one of transistors in pull up circuit 35 is also turned on because output 40 is at 0 v and is connected to the gate of transistor 55.

If, however, the voltage on contact 10 is above the first voltage detected by high voltage detector 15, then the output 40 is a high voltage, substantially equal (within 0.5 v) to the voltage on contact 10 and the well voltage of transistors 50 and 55 is switched to the voltage on contact 10. Also, output 40 connects to the gate of 55. With the gate and well of transistor 55 substantially equal to voltage on contact 10, transistor 55 is off; disconnecting the contact 10 from $V_{DD}$, regardless of the state of the selector output NDRVHIGH. The well of transistor 50 can optionally be connected to $V_{DD}$. A second pull up circuit 60 operates in a similar manner as 35 does with output 40, but in accordance with the NWKPUEN signal output by selector 45 in normal user mode. The signal NDRVHIGH is active (in this case low) when the multipurpose input/output circuit is configured to operate as an output with full output drive capability. The signal NWKPUEN is active (in this case low) when the multipurpose input/output circuit is configured to operate as an input with a weak pull-up.

If desired, a pull down circuit 65 can be activated by the selector output DRVLOW when the multipurpose input/output circuit is configured to operate as an output and a pull down capability is desired. Typically, input/output circuits also have electrostatic discharge protection circuitry 70. This type of circuitry is well known and accordingly the details of such circuitry are not discussed here. FIG. 1 also shows a buffer circuit 75 connected between the first high voltage detector 15 and the pull up circuit 35. The buffer circuit reduces the drive load on the output 40 of the first high voltage detector circuit 15. While FIG. 1 includes a buffer circuit 75, that circuit is not needed for operation of the overall circuit. An input buffer 80 serves to convert the contact voltage to a digital input and may be connected to contact 10 via, for example, a device input pin. For signal conditioning purposes, the input buffer 80 can comprise a Schmitt trigger buffer.

Figure 2:
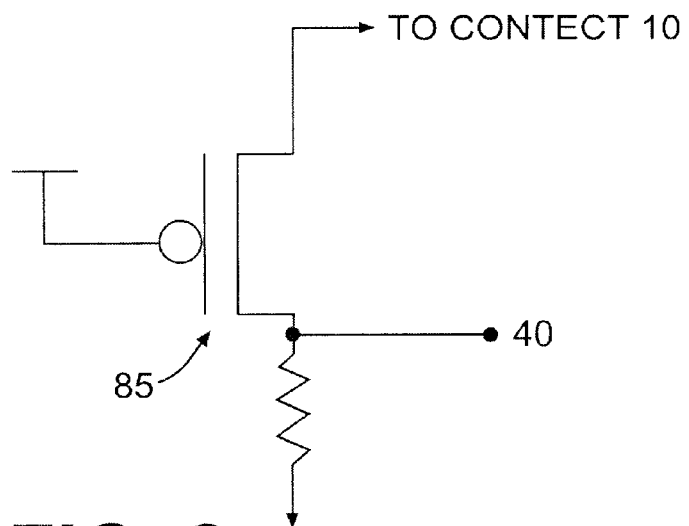
FIG. 2 is a schematic diagram of a schematic diagram of an exemplary high voltage detector.
Figure 3:
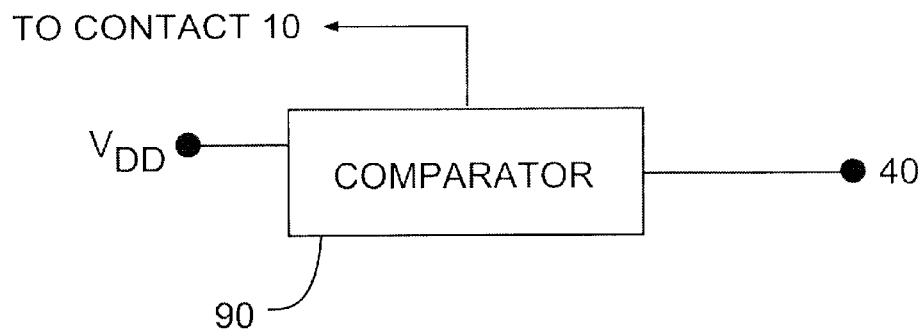
FIG. 3 is a schematic diagram of a schematic diagram of another exemplary high voltage detector.

FIG. 2 is a schematic diagram of an exemplary high voltage detector. This circuit can be used for either or both the first and second high voltage detectors 15 and 20. In FIG. 2 whenever the voltage at the contact 10 is, for example, a diode drop above $V_{DD}$, transistor 85 turns on. This causes the output 40 to rise toward the voltage on the contact 10. FIG. 3 is a schematic diagram of a schematic diagram of another exemplary high voltage detector. The FIG. 3 approach simply uses a comparator 90 to determine when the voltage on the contact 10 rises above $V_{DD}$.

Figure 4:
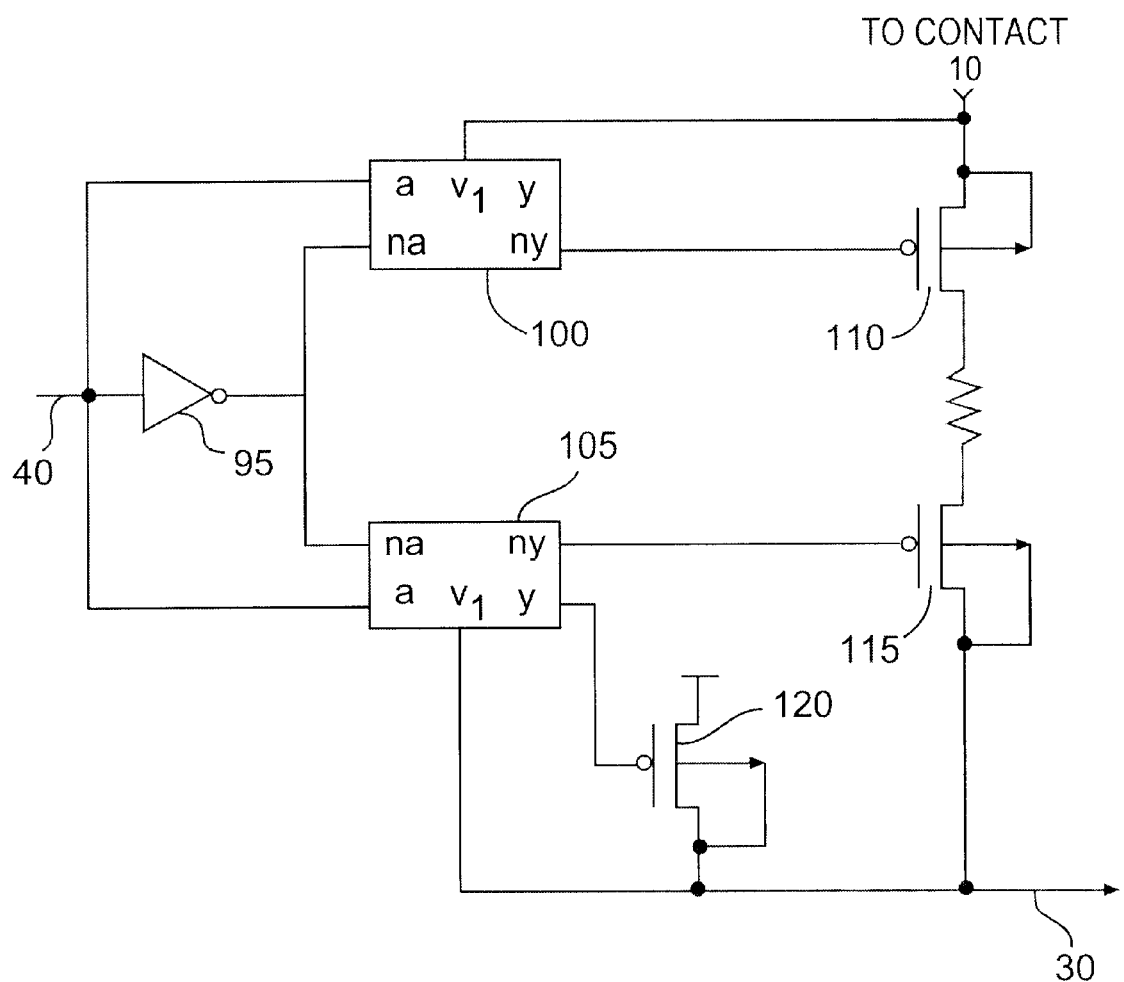
FIG. 4 is a schematic diagram of an exemplary portion of the FIG. 1 embodiment.

FIG. 4 is a schematic diagram of an exemplary portion of the FIG. 1 embodiment including high voltage switch 25. In FIG. 4, the output 40 of the first high voltage detector 15 is applied to an inverter 95 and to buffers 100 and 105. The output of the inverter 95 drives the buffers 100 and 105. In buffers 100 and 105, the output "y" has the same logic state as the input "a," and the output "ny" has the same logic state as the input "na." Accordingly, when the output 40 of the first high voltage detector 15 is a high, the gate of transistor 110 is a low and the gate of transistor 115 is a low. This causes both transistors 110 and 115 to turn on, connecting the output 30 to the contact 10.

When the output 40 of the first high voltage detector 15 is a low, both transistors 110 and 115 are off; disconnecting output 30 from the contact 10. Transistor 120, however, is turned on to pull output 30 toward $V_{DD}$.

Figure 5:
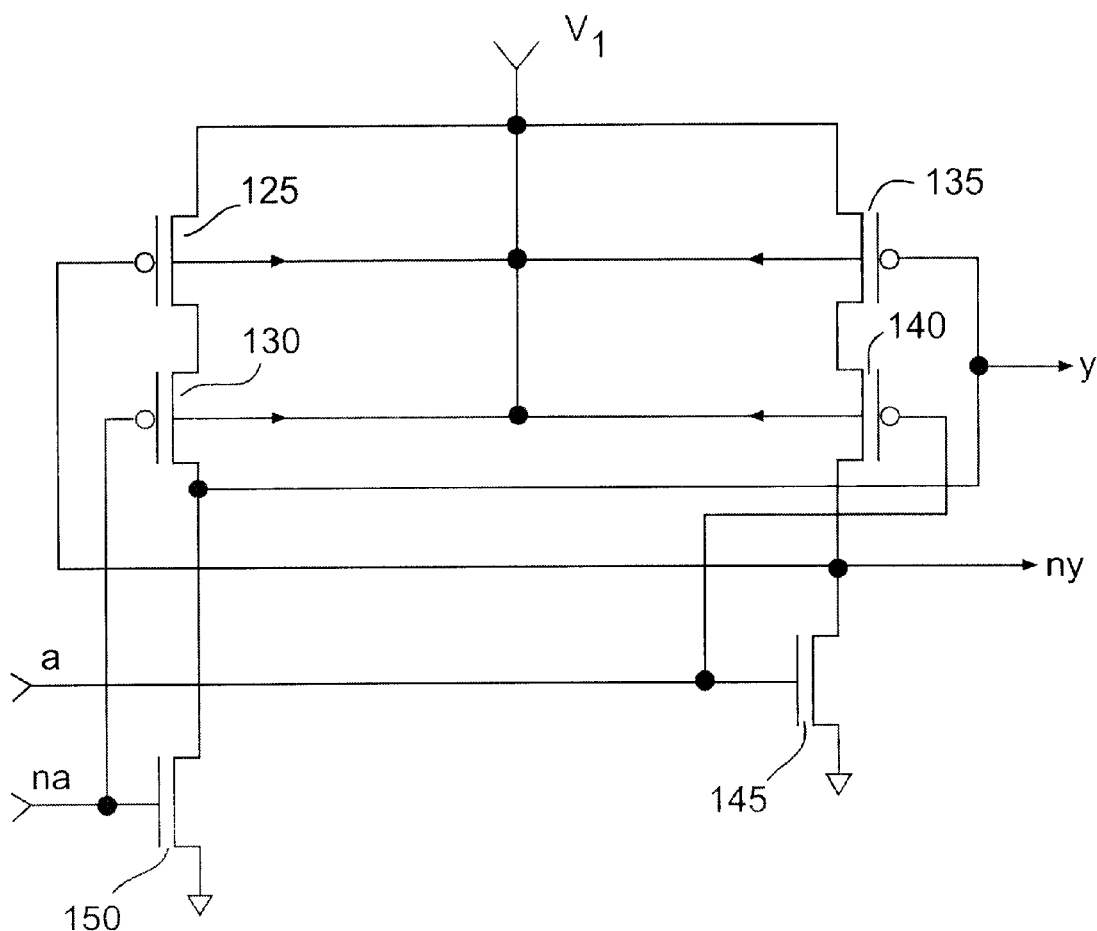
FIG. 5 is a schematic diagram of an exemplary high voltage buffer for the FIG. 4 high voltage switch.

FIG. 5 is a schematic diagram of an exemplary embodiment of the buffers 100 and 105 shown in FIG. 4. The input voltage $V_1$ is applied to the wells of transistors 125, 130, 135, and 140, and to the sources of transistors 125 and 135. When the input "a" is a high, transistor 145 is turned on pulling output "ny" toward the low voltage, such as 0 v or ground. Since input "na" is the logic opposite of input "a," it is a low when "a" is a high. This causes transistor 150 to turn off and transistor 130 to turn on. At the same time, since transistor 145 is on, the gate of transistor 125 is a low, turning transistor 125 on and pulling the output "y" toward the input voltage $V_1$, which is a high. In this exemplary embodiment of the buffers 100 and 105, the buffers provide both a buffering function and a voltage shifting function. In the present invention, it is not necessary for the buffers 100 and 105 to perform both of these functions.

What is claimed is:

1. A multipurpose input/output circuit operatively connected to a contact and operatively connectable to receive first and second supply voltages, comprising;
    a first voltage detector operatively connected to detect a first voltage;
    a second voltage detector operatively connected to detect a second voltage;
    a high voltage switch connected to provide a supply voltage or a contact voltage in accordance with the first voltage;
    a selector operatively connected to provide a plurality of selection signals;
    a bias circuit operatively connected to the high voltage switch and between the contact and at least one of the supply voltages and operatively connected to disconnect the contact from at least one of the supply voltages in response to at least one of the selection signals and detection of the first voltage.

2. A multipurpose input/output circuit according to claim 1, wherein the bias circuit comprises:

at least one set of series connected switches, and wherein one of the switches in a set being operatively connected to a corresponding one of the selection signals; and another one of the switches in the set being operatively connected to the high voltage switch and to the contact and to the first detector output.

3. A multipurpose input/output circuit according to claim 2, wherein each set of switches comprises a set of series connected transistors, and wherein another one of the transistors is operatively connected to the contact and to the high voltage switch and to the first detector output.

4. A multipurpose input/output circuit according to claim 3, wherein the another one of the transistors includes a well operatively connected to the high voltage switch.

5. A multipurpose input/output circuit according to claim 4, wherein the another one of the transistors is operatively connected between one of the transistors and the contact and includes a gate operatively connected to the first detector output.

6. A multipurpose input/output circuit operatively connected to a contact and operatively connectable to receive first and second supply voltages, comprising;

a first voltage detector operatively connected the contact and to detect a first voltage on the contact;

a second voltage detector operatively connected to the contact and to detect a second voltage on the contact representative of a purpose of the multipurpose input/output circuit;

a high voltage switch having an output and being operatively connected to the contact and to the first voltage detector and to receive the contact voltage;

a selector operatively connected to provide a plurality of selection signals; and a bias circuit operatively connected to the high voltage switch, to the contact and to the first voltage detector, and to receive at least one of the supply voltages and at least one of the selection signals.

7. A multipurpose input/output circuit according to claim 6, wherein the pull up circuit comprises:

at least one set of series connected transistors, and wherein
one of the transistors in a set having a gate operatively connected to a corresponding one of the selection signals; and
another one of the transistors in the set having a gate operatively connected to the first detector output and a drain operatively connected to the contact.

8. A multipurpose input/output circuit according to claim 7, the another one of the transistors includes a well operatively connected to the high voltage switch.

9. A multipurpose input/output circuit according to claim 8, wherein the another one of the transistors is operatively connected between the one of the transistors and the contact and includes a gate operatively connected to the first detector output.

10. A method of operating a multipurpose input/output circuit operatively connected to a contact and operatively connectable to receive first and second supply voltages, comprising:

(a) detecting a first voltage on the contact;

(b) detecting a second voltage on the contact representative of a purpose of the multipurpose input/output circuit;

(c) providing one of a high voltage and the first voltage responsive to detecting of step (a);

(d) providing a plurality of selection signals; and (e) selectively disconnecting the contact from one of the supply voltages responsive to at least one of the providing of step (c) and one of the selection signals.

* * * * *